United States Patent [19]

Ondris et al.

[11] Patent Number: 4,816,120
[45] Date of Patent: Mar. 28, 1989

[54] ELECTRODEPOSITED DOPED II-VI SEMICONDUCTOR FILMS AND DEVICES INCORPORATING SUCH FILMS

[75] Inventors: Miroslav Ondris, Chagrin Falls; Marty A. Pichler, Parma; Richard E. Brownfield, North Canton, all of Ohio

[73] Assignee: The Standard Oil Company, Cleveland, Ohio

[21] Appl. No.: 148,195

[22] Filed: Jan. 26, 1988

Related U.S. Application Data

[63] Continuation of Ser. No. 925,181, Oct. 31, 1986, abandoned, which is a continuation-in-part of Ser. No. 860,382, May 6, 1986, abandoned.

[51] Int. Cl.$^4$ .................. C25D 5/50; H01L 31/18; H01L 31/06
[52] U.S. Cl. .................. 204/37.1; 204/37.6; 204/86; 204/92; 204/56.1; 136/260; 136/264
[58] Field of Search .................. 204/37.1, 37.6, 2.1, 204/86, 92, 56.1; 136/260, 264

[56] References Cited

U.S. PATENT DOCUMENTS

| | | | |
|---|---|---|---|
| 4,260,427 | 4/1981 | Fulop et al. | 204/86 |
| 4,388,483 | 6/1983 | Basol et al. | 136/260 |
| 4,400,244 | 8/1983 | Kroger et al. | 204/2.1 |
| 4,425,194 | 1/1984 | Kroger et al. | 204/2.1 |
| 4,465,565 | 8/1984 | Zanio | 204/86 |
| 4,548,681 | 6/1985 | Basol et al. | 204/2.1 |
| 4,581,108 | 4/1986 | Kapur et al. | 204/86 |
| 4,592,807 | 6/1986 | Switzer | 204/2.1 |
| 4,595,791 | 6/1986 | Basol et al. | 204/2.1 |
| 4,608,750 | 9/1986 | Switzer | 204/2.1 |

OTHER PUBLICATIONS

Sella et al., "The Electrodeposition Mechanism of CdTe from Audio Aqueous Solution", J. Electrochem. Soc., vol. 133, No. 10, (1986), pp. 2043-2047.
Anthony et al., "Cds/CdTe Solar Cells by Close-Spaced Vapor Transport and Hot-Wall Vacuum Deposition", 18th IEEE Photovoltaic Specialists Conference, (1984), pp. 827-834.
Bhattacharya et al., "In Situ Preparation of p-Type CdTe Thin Films by Cathodic Electrodeposition", 132, J. Electrochemical Soc., (1985), pp. 732-734.
Bhattacharya et al., "Heterojunction CdS/CdTe Solar Cells Based on Electrodeposited p-CdTe Thin Flims: Fabrication and Characterization", 58, J. of App. Physics, (1985), pp. 3590-3593.
Rajeshwar, "Electrodeposition of p-CdTe and CdS/CdTe Heterojunction Devices", SERI Report 211-2789, Sep. 1985.

Primary Examiner—John F. Niebling
Assistant Examiner—Ben C. Hsing
Attorney, Agent, or Firm—Joseph G. Curatolo; Larry W. Evans

[57] ABSTRACT

A method of electrodepositing a doped compound semiconductor film including tellurium and a metal selected from Group IIB of the Period Table of Elements by adding an effective concentration of dopant ions to the electrolyte bath. Cadmium telluride, mercury cadmium telluride and zinc cadmium telluride may be doped with copper, silver and gold. The conductivity type of the electrodeposited doped layers may be changed by a heat treatment. Thin film photovoltaic cells incorporating the doped layer to form a heterojunction with a semiconductor layer of the opposite conductivity type show substantial improvements in open circuit voltage, fill factor and efficiency over similar devices employing undoped electrodeposited layers.

15 Claims, 1 Drawing Sheet

ELECTRODEPOSITED DOPED II-VI SEMICONDUCTOR FILMS AND DEVICES INCORPORATING SUCH FILMS

This disclosure is a continuation of U.S. patent application Ser. No. 925,181 filed Oct. 31, 1986, now abandoned, which is a continuation-in-part of U.S. patent application Ser. No. 860,382, filed May 6, 1986, now abandoned.

A key factor in making semiconductor devices, including photovoltaic devices, is the ability to incorporate controlled amounts of dopant elements in various regions of the devices. As is well known in the art, dopant elements can determine the conductivity characteristic of a semiconductor wafer of film, i.e. whether it is n-type of p-type, whether current is predominantly transported by electrons or by holes, respectively. The concentration of dopants present can control the concentration of charge carriers, i.e. the resistivity of the semiconductor. Control of the presence of dopants and their concentration is therefore essential if semiconductor devices having regions of relatively high or low resistivity, according to a predetermined design, are to be constructed. In thin film semiconductor devices it is generally necessary to incorporate a dopant element during the deposition process since bulk semiconductor doping techniques, such as diffusion, cannot be carried out without damaging the device structure.

Thin films of compound semiconductors composed of elements chosen from Groups IIB and VIB of the Periodic Table of Elements (as published by the American Chemical Society) may be formed by electrodeposition. Electrodeposition of cadmium telluride is taught in U.S. Pat. Nos. 4,400,244 and 4,425,194 to Kroger et al. Cadmium telluride is electrodeposited on a conductive cathode from an electrolyte containing $HTeO_2^+$ as a source of tellurium and $Cd^{2+}$ as the source of cadmium. Discharged $HTeO_2^+$ ions at the cathode react with $Cd^{2+}$ and form cadmium telluride deposits on the cathode.

A process for making heterojunction solar cells using these thin films is described in U.S. Pat. No. 4,388,483 to Basol et al. There, a substrate, such as glass, is coated by conventional techniques with a transparent conductive film, such as tin oxide or indium tin oxide. A layer of an n-type semiconductor, such as cadmium sulfide, is deposited on the conductor, preferably by an electrodeposition process. Thereafter, a semiconductor layer such as cadmium telluride is electrodeposited on the cadmium sulfide layer. The cadmium telluride layer as deposited exhibits n-type conductivity and therefore does not form a rectifying junction with the n-type cadmium sulfide. To produce a rectifying junction, the structure is heat-treated at a temperature between 250° C. and 500° C. for a time sufficient, e.g. 5 to 10 minutes, to convert the n-type cadmium telluride film to a relatively low resistivity p-type film. An ohmic contract, such as gold film, is deposited on the cadmium telluride film to complete the photovoltaic cell. The cell is illuminated through the glass substrate with the n-type semiconductor acting as a relatively wide energy band gap window layer.

A process for electrodepositing cadmium-rich mercury cadmium telluride is disclosed in U.S. Pat. No. 4,548,681 to Basol et al. Thin films of polycrystalline mercury cadmium telluride containing a controlled amount of mercury may be cathodically electrodeposited according to the teaching of that patent. While cadmium telluride has an optical energy band gap that is nearly ideal for adsorption of light from the solar spectrum, mercury cadmium telluride can more closely approach the ideal depending upon its mercury content. By varying the mercury content in mercury cadmium telluride, cells sensitive to different portions of the solar spectrum, tandem cells having different optical band gap energies, and varied energy band gap layers can be constructed. The disclosures of the patents cited in the preceding paragraphs are incorporated herein by reference.

However, none of the disclosures cited nor the publications of others teach how to incorporate in electrodeposited IIB-VIB compound semiconductor films impurities that can and do function as dopants. If excessive amounts of potential dopant elements are incorporated in a film, for example more than about $10^{20}$ atoms per cubic centimeter, alloys are formed and doping does not occur. If too little of such impurities are incorporated in a film, doping is so minor that it has a negligible effect on the resistivity of the deposited film. Therefore, it has not be previously determined how to incorporate effective quantities of impurities in an electrodepositing film, nor what impurities to incorporate in order to deposit a doped film.

SUMMARY OF THE INVENTION

The invention teaches (i) a method of electrodepositing a thin film of a compound semiconductor formed generally of elements selected from Groups IIB and VIB of the Periodic Table of Elements (as published by the American CHemical Society) and preferably one selected from Group IIB combined with tellurium, incorporating controlled amounts of at least one element selected from the metals in Group IB of the Periodic Table and (ii) thin film semiconductor devices including at least one such film. The novel method is particularly directed toward cadmium telluride, mercury cadmium telluride and cadmium zinc telluride films. Cadmium telluride is an especially appropriate material to which the invention may be applied.

In accordance with the invention, thin films of doped polycrystalline IIB-VIB semiconductors may be cathodically electrodeposited on conductive substrates from an aqueous solution containing controlled amounts of at least one impurity that can dope the deposited semiconductor films. Metals selected from Group IB of the Periodic Table of Elements (as published by the American Chemical Society) such as copper, silver, and gold are dopant candidates. The concentration of impurities in the electrolyte bath does not exceed about twenty-four parts per billion and preferably ranges between about a few tenths and about twenty four parts per billion to achieve the desired concentration in the deposited film.

Thin film solar cells may be formed using the semiconductor layers deposited by the method described above in conjunction with known methods, such as those taught in U.S. patents cited above.

DETAILED DESCRIPTION OF PREFERRED EMBODIMENTS

Figure 1:
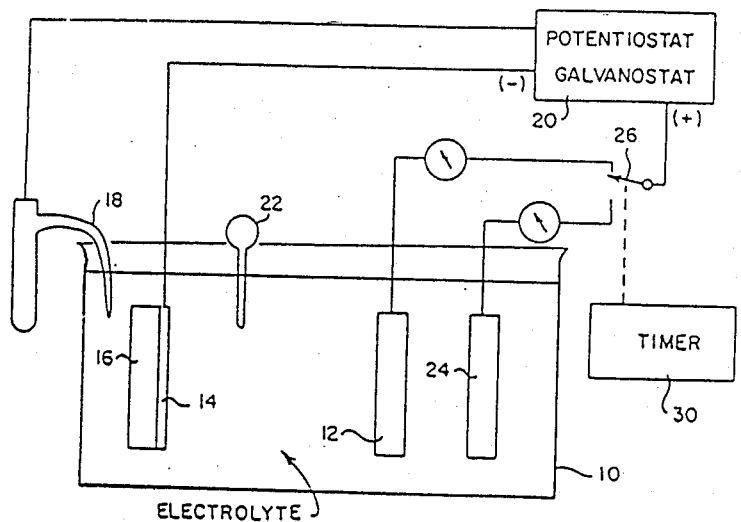
FIG. 1 is a schematic diagram of an electrodeposition apparatus suitable for carrying out the novel process.

In FIG. 1, a chemical electrodeposition bath apparatus for carrying out the novel process is shown schematically. A vessel 10 holds the electrolyte, which for electrodepositing a film of cadmium telluride is an aqueous solution containing $CD^{2+}$, $HTeO_2^+$ ions and the dopant impurities to be incorporated into the deposited film. A cathode comprising a conductive film 14 on a glass substrate 16 is opposed by a tellurium anode 12. A reference electrode 18 is connected to a potentiostat/galvanostat 20. A thermometer 22 monitors the temperature of the electrolyte. An inert graphite anode 24 is preferably, although not necessarily, disposed in the bath. If anode 24 is present, switch 26 alternately connects one of anodes 12 and 24 to the potentiostat/galvanostat 20 for applying power to those anodes in a controlled manner. Switch 26 is shown as a manual switch, but in practice may be an electronic switch controlled by a timing circuit 30. Reference electrode 18 is preferably a 0.1 M Ag-AgCl reference electrode. In depositing cadmium telluride, ions of the dopant impurity may be supplied in any convenient manner, such as by adding appropriate salts or solutions of salts to the electrolytic bath. Examples of such salts include copper sulfate, copper chloride, silver sulfate, silver chloride, sodium gold chloride and gold trichloride, for adding copper, silver or gold. More complex compounds may also be used to supply the dopant ions. The dopant impurity may also be supplied by a consumable anode that releases a controlled amount of dopant impurity into the bath. The potential applied to the bath is adjusted so that under open circuit conditions the potential at the surface of the depositing film with respect to reference electrode 18 (i.e. the quasi-rest potential), is between about $-300$ mV and $-650$ mV. The temperature of the electrolyte is maintained at 80° to 90° C.

For depositing cadmium telluride, the aqueous electrolyte preferably contains from about 0.2 M to about 1.5 M $Cd^{2+}$ ions, from about $10^{-5}$ to about $10^{-3}$ M of $HTeO_2^+$ ions and small amounts of a dopant impurity. The pH of the bath is adjusted to between 1 and 3 by the addition of an acid such as sulfuric or hydrochloric acid. Dopant impurity ions are added to the solution, before deposition begins, in a concentration of from about one-tenth to twenty four parts per billion. As pointed out in U.S. Pat. No. 4,548,681, which is incorporated herein by reference, particularly in its Example 3 in columns 7 and 8, it is desirable to include halide ions, especially chloride ions, in the electrolyte from which II-VI films are electrodeposited in order to improve the efficiency of photovoltaic devices made from those films. Chloride ions can be supplied from a chloride salt that is added to the electrolyte in accordance with this invention to supply dopant atoms (e.g. copper chloride) and/or from the acid added to the electrolyte to adjust is pH.

Figure 2:
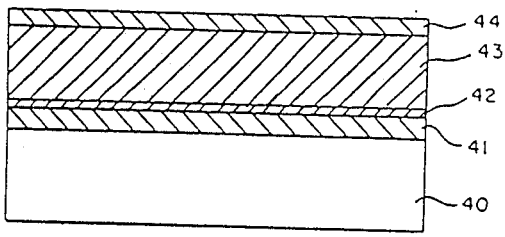
FIG. 2 is a cross-sectional view of a solar cell in accordance with the invention.

FIG. 2 is a cross-sectional view of a photovoltaic device that may be formed using the novel doping method. A substrate 40 of an insulating transparent material, such as glass, has a layer 41 of a conductive transparent material, such as tin oxide, indium tin oxide or zinc oxide disposed on it. A thin film 42 of a first semiconductor material, such as cadmium sulfide, is disposed on layer 41. In typical photovoltaic devices, electrodeposited thin films of cadmium sulfide are preferably less than 100 nm in thickness. A second thin semiconductor film 43, such as cadmium telluride, is disposed on first semiconductor layer 42. In a typical photovoltaic device including an active cadmium telluride thin film layer, that film is 1000 to 1300 nm in thickness. Layer 43 is a doped layer electrodeposited in accordance with the novel process. A thin film 44 of a metal, such as nickel or gold, is disposed on film 43 as one electrical contact of the device. Layer 41 serves as the other contact. Access to layer 41 is obtained by protecting part of it from the deposition bath and removing any mask from it thereafter. From this description, it can be seen that the term thin film as used here refers to deposited layers, rather than bulk materials such as wafers cut from an ingot or other self supporting pieces of material. Generally such thin films are no more than about 2500 nm in thickness.

Doped cadmium telluride films deposited in accordance with the invention are characteristically n-type, in spite of the presence of a dopant element impurity. P-n heterojunction photovoltaic cells similar to the one shown in FIG. 2 are produced when a doped, n-type cadmium telluride layer is heat treated in accordance with the process disclosed in U.S. Pat. No. 4,388,483 to Basol et al. to convert it to p-type conductivity. Solar cells in accordance with the invention were heat treated at about 400° C. in air for about eight minutes to form the p-n junction. After the heat treatment and cooling, the surface of the doped cadmium telluride film was etched in about a 0.1 % bromine in methanol solution. The bromine etch was followed by etching in a dichromate solution, such as "Dichrol" available from American Scientific Products, for about 1 second. After rinsing in deionized water, the entire structure was immersed in hydrazine monohydrate for about 10 minutes at room temperature. Thereafter, evaporated gold was condensed as a film on the etched cadmium telluride film to form the "back" or rear electrical contact of the photovoltaic cell. Electrical contact to transparent, electrically conducting film 41 was made after access was gained as already described. That electrical contact is the other electrical terminal of the device.

The photovoltaic cells made by the process just described were tested under illumination from a calibrated solar spectrum simulator having an intensity corresponding to AM 1.5 (the intensity of solar radiation after passing through the terrestrial atmosphere at a 30° angle of incidence). Except as noted in Table 1, the approximate area of the solar cells was about 0.07 cm². The short circuit current, open circuit voltage and fill factor of each solar cell was measured at room temperature and the effective efficiency of the cell calculated by multiplying the three measured values and dividing their product by the area of the back contact cell and the amount of light energy falling on that area.

The measured properties of representative photovoltaic cells according to the invention are listed in Table 1 as Examples 2–6D. Example 1 is a control cell not made according to the invention. The process employed to make the cell of Example 1 began by cleansing the plating bath. A platinum mesh cathode was immersed in the bath and a current was passed between the cathode and anode while the bath was vigorously stirred for about 2.5 hours. In that time, a total charge of about 1452 coulombs flowed. After the bath purification step, a glass substrate bearing a layer of indium tin oxide overlaid by a layer of cadmium sulfide was immersed in the bath as the cathode in substitution for the platinum mesh. A cadmium telluride layer was electrodeposited on the cadmium sulfide. This three layer structure was further processed as already described, including a heat treatment, to form the Example 1 solar cell which exhibited an effective efficiency of about 5.66%.

TABLE 1

Measured Properties of Solar Cells Including Electrodeposited Doped Layers of Cadmium Telluride

| Example | Dopant | Dopant Concentration In Solution (ppb) | $I_{sc}$ (mA) | $V_{oc}$ (V) | Fill Factor | Efficiency (Percent) |
|---|---|---|---|---|---|---|
| 1 | — | — | 1.41 | .631 | .450 | 5.66 |
| 2 | Cu | 24 | 1.26 | .708 | .597 | 7.61 |
| 3 | Cu | 6 | 1.42 | .702 | .574 | 8.09 |
| 4 | Cu | 6 to 12 | 1.42 | .710 | .590 | 9.18 |
| 5 | Ag | 6 to 12 | 1.38 | .639 | .586 | 7.06 |
| 6A | Ag | 6 to 12 | 1.50 | .702 | .582 | 8.67 |
| 6B | Ag | 6 to 12 | 4.22* | .702 | .590 | 9.82 |
| 6C | Ag | 6 to 12 | 4.28* | .709 | .579 | 9.87 |
| 6D | Ag | 6 to 12 | 4.39* | .725 | .575 | 10.3 |

*Cell surface area = 0.18 cm$^2$

In Example 2, about 24 parts per billion Cu$^{2+}$ ions were added to a previously purified electrodeposition bath. The copper ions were supplied by the addition of copper sulfate to the electrolyte. The Example 2 solar cell was then prepared by the same process described for the Example 1 cell, except for the presence of copper ions in the deposition bath. As can be seen from Table 1, the incorporation of copper ions in the electrodeposited cadmium telluride layer increased the open circuit voltage and fill factor of the solar cell that included the doped layer. The effective efficiency of the photovoltaic cell was about 7.61%.

In Example 3, the process described for Example 1 was again followed, except that the concentration of copper ions in the electrolyte was reduced to about 6 parts per billion. Photovoltaic cells made from the indium tin oxide-cadmium sulfide-cadmium telluride structure including the cadmium telluride layer deposited from this electrolyte exhibited an open circuit voltage of about 0.702 V, a short circuit current of about 1.42 mA and an overall fill factor of about 0.574. The effective efficiency was about 8.09%. The same plating solution was subsequently used to deposit a second cadmium telluride film. Thereafter, an additional 6 parts per billion of copper ions were added to the electrolytic bath. After this replenishing, another cadmium telluride film was deposited on layers of indium tin oxide and cadmium sulfide. The Example 4 solar cell was prepared from this deposition and had the measured characteristics shown in Table 1, including an effective efficiency of about 9.185.

The concentration of copper ions incorporated into the deposited cadmium telluride films was estimated in two different ways with similar results. Deposited films were analyzed by secondary ion mass spectroscopy (SIMS) which indicated a copper concentration of about 10$^{18}$ atoms per cubic centimeter, i.e. approximately 100 parts per million. That concentration is much higher than the concentration of copper atoms in the electrodeposition bath. Because of the larger concentration of dopant ions in the film than the solution, the quantity of dopant ions in the solution is reduced over time as films are electrodeposited. We found that dopant ion concentration in a bath was so depleted after about five depositions that it had to be refreshed to achieve the desired doping. Considering the volume of our baths and the initial dopant ion concentration, we calculated from the dopant depletion rate that the concentration of ions in the deposited films is about 10$^{18}$ atoms per cubic centimeter, correlating well with the SIMS measurement. The resistivity of the doped films, compared to that of undoped films, indicated that on the order of 10$^{15}$ dopant atoms per cubic centimeter are electrically active in the deposited films. In any event, the doping process is repeatable and no more than 10$^{20}$ atoms per cubic centimeter are incorporated in the deposited films. These results show that doping is occurring in the process and that a ternary alloy is not being deposited. We have also noted that some of the impurities (e.g. silver) that can dope the deposited films can also affect the morphology of the films even when present in very small concentrations.

An electrodeposition bath of the type described was purified by passing a current through the bath using a platinum mesh cathode as previously described. Then, silver ions were added to the electrolyte bath at a concentration of about 6 parts per billion by the addition of silver sulfate solution. After two electrodeposition trials, an additional 6 parts per billion of Ag$^+$ was added to the electrolyte to increase the Ag$^+$ concentration in the solution to between 6 and 12 parts per billion. The measured characteristics of a solar cell including a silver doped cadmium telluride layer electrodeposited from this bath are listed as Example 5 in Table 1. The effective efficiency of this cell was about 7.06%. Subsequent depositions were made using the same bath without any further addition of silver ions. The measured characteristics of a number of solar cells all including a doped film deposited from the fifth deposition made from this electrolyte bath are listed in Table 1 as Examples 6A-6D. Example 6A had an effective efficiency of about 8.67%. Example 6B had a surface area of approximately 0.18 cm$^2$ and an effective efficiency of about 9.82%. Examples 6C and 6D, with surface areas of about 0.18 cm$^2$ each, were tested under daylight conditions, rather than with the solar spectrum simulator, on two consecutive days. The measured daylight effective efficiencies of these cells were about 9.87% and 10.3%, respectively.

While the results reported above are for impurity concentrations in the electrolyte bath ranging from 6 to 24 parts per billion, we have observed improved performance in cells including cadmium telluride in films deposited from baths containing impurity concentrations as low as 0.1 parts per billion.

The invention has been described with regard to certain specific embodiments. Various additions and modifications within the spirit of the invention will occur to those of skill in the art. Therefore, the scope of the invention is limited only by the following claims.

We claim:

1. A method of making a p-type compound semiconductor film including tellurium and a metal selected from Group IIB of Periodic Table of the Elements comprising:
   preparing an acidic, aqueous electrolyte containing ions of a metal selected from Group IIB of the Periodic Table of Elements;
   adding ions of a metal selected from Group IB of the Periodic Table of Elements to said electrolyte in a concentration not exceeding about 24 parts per billion;
   immersing a cathode and a tellurium anode in said electrolyte;

applying a potential between said cathode and anode to deposit on said cathode an n-type compound semiconductor film comprising tellurium and said Group IIB metal doped with said Group IB metal; and heat treating said film to change its conductivity type from n-type to p-type.

2. The method of claim 1 including depositing a doped film of cadmium telluride.

3. The method of claim 1 including depositing a doped film selected from the group consisting of mercury cadmium telluride and zinc cadmium telluride.

4. The method of claim 1 including depositing said film on a cathode comprising glass bearing a transparent electrically conducting film overlaid by a film of cadmium sulfide.

5. The method of claim 1 including adding said Group IB metal ions by adding to the electrolyte a salt containing said metal.

6. The method of claim 1 including adding said Group IB metal ions by immersing in said electrolyte a consumable anode containing said metal in said electrolyte.

7. The method of claim 1 including selecting said dopant ions from the group consisting of copper, silver and gold.

8. The method of claim 1 including adding dopant ions to said electrolyte to establish a concentration of dopant ions ranging from about 0.1 to about 24 parts per billion.

9. The method of claim 1 including adding dopant ions to said electrolyte to establish a concentration of dopant ions ranging from about 6 to about 12 parts per billion.

10. The method of claim 1 including depositing a semiconductor film comprising tellurium and said Group IIB metal containing said Group IB metal as a dopant impurity in a concentration less than $10^{20}$ atoms per cubic centimeter.

11. A method of making an improved photovoltaic cell comprising:

preparing an acidic, aqueous electrolyte containing cadmium ions;

adding ions of at least one of copper, silver and gold to said electrolyte in a concentration not exceeding about 24 parts per billion;

immersing in said electrolyte a cathode having an exposed film of cadmium sulfide;

immersing a tellurium anode in said electrolyte;

applying a potential between said cathode and said anode to deposit on said cadmium sulfide film an n-type compound semiconductor film of cadmium and tellurium containing as a dopant impurity the at least one of copper, silver and gold added to the electrolyte; and heating treating said compound film to change its conductivity type from n-type to p-type.

12. The method of claim 11 wherein said compound film is cadmium telluride.

13. The method of claim 12 including depositing said cadmium telluride film containing a concentration of less than $10^{20}$ atoms per cubic centimeter of the at least one of copper, silver and gold added to the electrolyte.

14. The method of claim 11 including adding ions of one of mercury and zinc to said electrolyte and depositing one of films of cadmium mercury telluride and cadmium zinc telluride on said cathode.

15. The method of claim 14 including depositing said film of one of cadmium mercury telluride and cadmium zinc telluride containing a concentration of less than $10^{20}$ atoms per cubic centimeter of one of copper, silver and gold as a dopant impurity.

* * * * *